United States Patent
Williams-Duncan

(10) Patent No.: US 9,992,875 B2
(45) Date of Patent: Jun. 5, 2018

(54) COATED ELECTRICAL ASSEMBLY

(71) Applicant: Semblant Limited, Melbourn, Herfordshire (GB)

(72) Inventor: Elizabeth Williams-Duncan, Nottingham (GB)

(73) Assignee: Semblant Limited, Chelsea Harbour, London (GB)

( * ) Notice: Subject to any disclaimer, the term of this patent is extended or adjusted under 35 U.S.C. 154(b) by 277 days.

(21) Appl. No.: 14/779,731

(22) PCT Filed: Mar. 25, 2014

(86) PCT No.: PCT/GB2014/050945
§ 371 (c)(1),
(2) Date: Nov. 17, 2015

(87) PCT Pub. No.: WO2014/155099
PCT Pub. Date: Oct. 2, 2014

(65) Prior Publication Data
US 2017/0245374 A1    Aug. 24, 2017

(30) Foreign Application Priority Data
Mar. 26, 2013   (GB) .................................. 1305500.9

(51) Int. Cl.
*H01L 23/552*    (2006.01)
*H01L 23/00*     (2006.01)
(Continued)

(52) U.S. Cl.
CPC ............. *H05K 3/282* (2013.01); *H05K 1/181* (2013.01); *H05K 3/285* (2013.01);
(Continued)

(58) Field of Classification Search
CPC ............. H01L 21/32138; H01L 23/552; H01L 23/564; H01L 23/562; H01L 2224/80007;
(Continued)

(56) References Cited

U.S. PATENT DOCUMENTS

| | | | |
|---|---|---|---|
| 8,995,146 B2 * | 3/2015 | Brooks | H05K 3/284 174/350 |
| 2004/0185678 A1 * | 9/2004 | Lee | H01L 21/0212 438/780 |

(Continued)

*Primary Examiner* — David Zarneke
(74) *Attorney, Agent, or Firm* — Baker Botts L.L.P.

(57) ABSTRACT

The present invention relates to an electrical assembly which has a conformal coating, wherein said conformal coating is obtainable by a method which comprises: (a) plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface of the electrical assembly: wherein: $R_1$ represents $C_1$-$C_3$ alkyl or $C_2$-$C_3$ alkenyl; $R_2$ represents hydrogen, $C_1$-$C_3$ alkyl or $C_2$-$C_3$ alkenyl; $R_3$ represents hydrogen, $C_1$-$C_3$ alkyl or $C_2$-$C_3$ alkenyl; $R_4$ represents hydrogen, $C_1$-$C_3$ alkyl or $C_2$-$C_3$ alkenyl; $R_5$ represents hydrogen, $C_1$-$C_3$ alkyl or $C_2$-$C_3$ alkenyl; and $R_6$ represents hydrogen, $C_1$-$C_3$ alkyl or $C_2$-$C_3$ alkenyl, and (b) plasma polymerization of a compound of formula (I) and deposition of the resulting polymer onto the polymer formed in step (a).

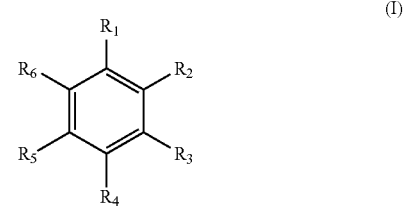

(I)

11 Claims, 3 Drawing Sheets

(51) Int. Cl.
*H01L 21/3213* (2006.01)
*H05K 3/28* (2006.01)
*H05K 1/18* (2006.01)

(52) U.S. Cl.
CPC ...... *H01L 21/32138* (2013.01); *H01L 23/552* (2013.01); *H01L 23/562* (2013.01); *H01L 23/564* (2013.01); *H01L 2224/80007* (2013.01); *H01L 2224/81007* (2013.01); *H01L 2224/82007* (2013.01); *H01L 2224/83007* (2013.01); *H01L 2224/84007* (2013.01); *H01L 2224/85007* (2013.01); *H01L 2224/86007* (2013.01); *H05K 2201/09872* (2013.01); *H05K 2203/095* (2013.01); *H05K 2203/1322* (2013.01); *H05K 2203/1333* (2013.01); *H05K 2203/1377* (2013.01)

(58) Field of Classification Search
CPC . H01L 2224/81007; H01L 2224/82007; H01L 2224/83007; H01L 2224/84007; H01L 2224/85007; H01L 2224/86007; H05K 2201/09872; H05K 2203/1322; H05K 2203/1377
See application file for complete search history.

(56) References Cited

U.S. PATENT DOCUMENTS

| | | | |
|---|---|---|---|
| 2007/0020451 A1* | 1/2007 | Padiyath | B05D 7/546 428/336 |
| 2009/0021156 A1* | 1/2009 | Kinoshita | G02F 1/136259 313/504 |
| 2010/0072885 A1* | 3/2010 | Watanabe | C07C 13/567 313/504 |
| 2012/0257364 A1* | 10/2012 | Brooks | H05K 3/284 361/760 |
| 2013/0033825 A1* | 2/2013 | Brooks | H05K 3/284 361/748 |
| 2015/0001700 A1* | 1/2015 | Hartung | H01L 23/564 257/698 |
| 2015/0303389 A1* | 10/2015 | Kim | H01L 51/0097 257/40 |
| 2017/0245374 A1* | 8/2017 | Williams-Duncan | H05K 3/282 |

\* cited by examiner

COATED ELECTRICAL ASSEMBLY

PRIORITY

This nonprovisional application is a U.S. National Stage Filing under 35 U.S.C. § 371 of International Patent Application Serial No. PCT/GB2014/050945 filed Mar. 25, 2014, and entitled "Coated Electrical Assembly" which claims priority to GB1305500.9 filed Mar. 26, 2013 and entitled "Coated Electrical Assembly".

FIELD OF THE INVENTION

The present invention relates to a coated electrical assembly and to methods of preparing a coated electrical assembly.

BACKGROUND TO THE INVENTION

Conformal coatings have been used for many years in the electronics industry to protect electrical assemblies from environmental exposure during operation. A conformal coating is a thin, flexible layer of protective lacquer that conforms to the contours of an electrical assembly, such as a printed circuit board, and its components.

There are 5 main classes of conformal coatings, according to the IPC definitions: AR (acrylic), ER (epoxy), SR (silicones), UR (urethanes) and XY (paraxylylene). Of these 5 types, paraxylylene (or parylene) is generally accepted to offer the best chemical, electrical and physical protection. However, the deposition process is time consuming and expensive, and the starting material is expensive.

Parylene is polymer with the following structure:

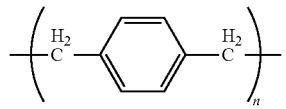

Parylene is deposited using a three stage vapour deposition process. A solid precursor is heated under vacuum and sublimes. It is important to appreciate that parylene, although sometimes erroneously called "paraxylene", is not in fact prepared from the compound paraxylene. In fact, the precursor is [2.2]paracyclophane:

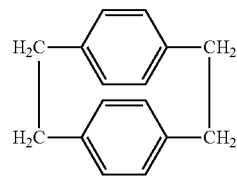

The chemical vapour is then passed through a high temperature furnace at around 680° C., so that the precursor splits into a reactive monomer. This reactive monomer then feeds into a deposition chamber and polymerizes on the surface of the substrate. Typical coating thicknesses for parylene are between 5 and 25 microns.

The parylene deposition technique described above is not ideal because of the high cost of the starting material, the high thermal energy consumption during monomer generation, the high vacuum requirements and the low growth rate.

There is therefore a need for conformal coatings that offer at least similar levels of chemical, electrical and physical protection as parylene, but that can be manufactured more easily and cheaply. For certain applications, it can also be important that the conformal coatings can withstand the conditions used in rework processes and reflow processes.

SUMMARY OF THE INVENTION

It is a finding of the present invention that that a multilayer coating comprising a first layer formed by plasma polymerization of a mixture of a fluorohydrocarbon and a compound of formula (I), and a second layer formed by plasma polymerization of a compound of formula (I) provides a highly effective conformal coating. The coating is more effective than would be expected, based on the properties of single layer coatings obtainable by plasma polymerization of each monomer alone. Adding further layers of the plasma polymerized polymers, such that the conformal coating comprises three or more layers, can provide further improvements in the properties of the conformal coating.

It is a further finding of the invention that the multilayer coatings provide a physically robust conformal coating, which can withstand the use of solvents (such as 2-propanol) in rework and thermal ramps in reflow processes.

Accordingly, the present invention thus provides an electrical assembly which has a conformal coating, wherein said conformal coating is obtainable by a method which comprises:

(a) plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface of the electrical assembly:

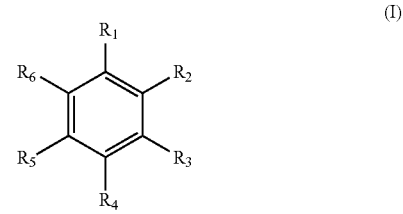

wherein:

$R_1$ represents $C_1$-$C_3$ alkyl or $C_2$-$C_3$ alkenyl;

$R_2$ represents hydrogen, $C_1$-$C_3$ alkyl or $C_2$-$C_3$ alkenyl;

$R_3$ represents hydrogen, $C_1$-$C_3$ alkyl or $C_2$-$C_3$ alkenyl;

$R_4$ represents hydrogen, $C_1$-$C_3$ alkyl or $C_2$-$C_3$ alkenyl;

$R_5$ represents hydrogen, $C_1$-$C_3$ alkyl or $C_2$-$C_3$ alkenyl; and $R_6$ represents hydrogen, $C_1$-$C_3$ alkyl or $C_2$-$C_3$ alkenyl, and (b) plasma polymerization of a compound of formula (I) and deposition of the resulting polymer onto the polymer formed in step (a).

The invention further provides a method for conformally coating an electrical assembly, which method comprises:

(a) plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface of the electrical assembly:

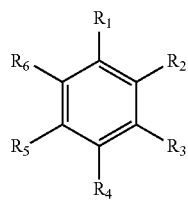

(I)

wherein:
$R_1$ represents $C_1$-$C_3$ alkyl or $C_2$-$C_3$ alkenyl;
$R_2$ represents hydrogen, $C_1$-$C_3$ alkyl or $C_2$-$C_3$ alkenyl;
$R_3$ represents hydrogen, $C_1$-$C_3$ alkyl or $C_2$-$C_3$ alkenyl;
$R_4$ represents hydrogen, $C_1$-$C_3$ alkyl or $C_2$-$C_3$ alkenyl;
$R_5$ represents hydrogen, $C_1$-$C_3$ alkyl or $C_2$-$C_3$ alkenyl; and
$R_6$ represents hydrogen, $C_1$-$C_3$ alkyl or $C_2$-$C_3$ alkenyl, and
(b) plasma polymerization of a compound of formula (I) and deposition of the resulting polymer onto the polymer formed in step (a).

DETAILED DESCRIPTION OF THE INVENTION

Figure 1:
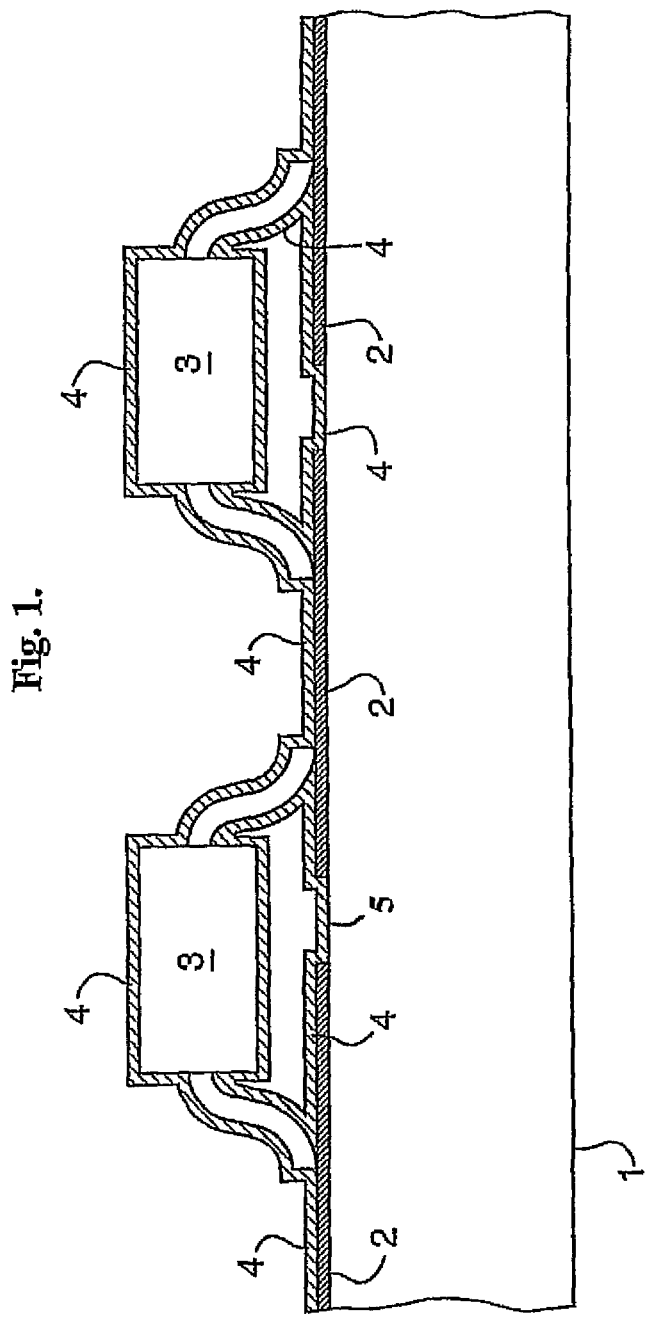
FIG. 1 shows an example of an electrical assembly of the invention which has a conformal coating.

The conformal coating of the invention is obtainable by plasma polymerization of specific precursor compounds and deposition of the resulting polymers. The polymerization reactions occur in situ. Polymerization therefore typically occurs on the surface at which deposition occurs. Polymerization and deposition are thus typically simultaneous.

Plasma-polymerized polymers are a unique class of polymers which cannot be prepared by traditional polymerization methods. Plasma-polymerized polymers have a highly disordered structure and are generally highly crosslinked, contain random branching and retain some reactive sites. Plasma-polymerized polymers are thus chemically distinct from polymers prepared by traditional polymerization methods known to those skilled in the art. These chemical and physical distinctions are well known and are described, for example in *Plasma Polymer Films*, Hynek Biederman, Imperial College Press 2004.

Plasma polymerization is typically carried out in a reactor that generates a gas plasma which comprises ionized gaseous ions, electrons, atoms and/or neutral species. A reactor typically comprises a chamber, a vacuum system, and one or more energy sources, although any suitable type of reactor configured to generate a gas plasma may be used. The energy source may include any suitable device configured to convert one or more gases to a gas plasma. Preferably the energy source comprises a heater, radio frequency (RF) generator, and/or microwave generator.

Typically, the electrical assembly is placed in the chamber of a reactor and a vacuum system is used to pump the chamber down to pressures in the range of $10^{-3}$ to 10 mbar. One or more gases is typically then pumped into the chamber and an energy source generates a stable gas plasma. One or more precursor compounds is typically then be introduced, as gases and/or liquids, into the gas plasma in the chamber. When introduced into the gas plasma, the precursor compounds are typically ionized and/or decomposed to generate a range of active species in the plasma that polymerize to generate the polymer.

The exact nature and composition of the polymer deposited typically depends on one or more of the following conditions (i) the plasma gas selected; (ii) the particular precursor compound(s) used; (iii) the amount of precursor compound(s) (which may be determined by the combination of the pressure of precursor compound(s) and the flow rate); (iv) the ratio of precursor compound(s); (v) the sequence of precursor compound(s); (vi) the plasma pressure; (vii) the plasma drive frequency; (viii) the pulse width timing; (ix) the coating time; (x) the plasma power (including the peak and/or average plasma power); (xi) the chamber electrode arrangement; and/or (xii) the preparation of the incoming assembly.

Typically the plasma drive frequency is 1 kHz to 1 GHz. Typically the plasma power is 100 to 250 W, preferably 150 to 200 W, for example about 175 W. Typically the mass flow rate is 5 to 100 sccm, preferably 5 to 20 sccm, for example about 10 sccm. Typically the operating pressure is 10 to 100 mTorr, for example about 50 mTorr. Typically the coating time is 10 seconds to 20 minutes.

However, as a skilled person will appreciate, the preferred conditions will be dependent on the size and geometry of the plasma chamber. Thus, depending on the specific plasma chamber that is being used, it may be beneficial for the skilled person to modify the operating conditions.

The conformal coatings of the invention comprise at least one layer which is obtainable by plasma polymerization of a mixture or blend of compound of formula (I) and fluorohydrocarbon. Inclusions of a layer which is obtainable by plasma polymerization of a mixture or blend of compound of formula (I) and fluorohydrocarbon increases the robustness of the conformal coating. It is believed that this may arise due to improved interaction and adhesion between the conformal coating and the substrate to be coated, and between the layers of the conformal coating.

When this blend or mixture of monomers is plasma polymerized, the monomers which are compounds of formula (I) will react with both monomers which are fluorohydrocarbons and/or other monomers which are compounds of formula (I). Similarly, the monomers which are fluorohydrocarbons will react with both monomers which are compounds of formula (I) and/or with other monomers which are fluorohydrocarbons.

The molar ratio of the compound of formula (I) to the fluorohydrocarbon is from 5:95 to 50:50, typically from 10:90 to 40:60, preferably from 20:80 to 40:60, more preferably from 25:75 to 35:65. A particularly preferred molar ratio of the compound of formula (I) to the fluorohydrocarbon is 30:70.

The molar ratio of the compound of formula (I) to the fluorohydrocarbon can be readily adjusted by, for example, modifying the flow rates of the monomer compounds into the plasma chamber. A skilled person in this field can readily adjust the plasma polymerization process in order to achieve the desired ratio of compound of formula (I) to fluorohydrocarbon.

The present invention involves formation of the conformal coating by depositing a first polymer by plasma polymerization of a mixture or blend of compound of formula (I) and fluorohydrocarbon, and then a second polymer by plasma polymerization of a compound of formula (I). The resulting conformal coating will thus comprise two layers, which are preferably discrete. The first layer is in contact with surface of the electrical assembly and comprises the polymer formed by plasma polymerization of the compound of formula (I) and fluorohydrocarbon. This blended layer is advantageous, as it adheres well to the substrate. The second layer is in contact with the first layer and comprises the polymer formed by plasma polymerization of the compound of formula (I). The blended first layer also adheres well to the second layer, which is advantageous.

The deposition process of the invention can be repeated as often as desired, to build up a conformal coating comprising multiple layers, which are preferably discrete.

Where two or more layers of a polymer formed by plasma polymerization of a compound of formula (I) and a fluorohydrocarbon are present, each compound of formula (I) and each fluorohydrocarbon used may be the same or different, and are preferably the same.

Where two or more layers of a polymer formed by plasma polymerization of a compound of formula (I) are present, each compound of formula (I) used may be the same or different, and are preferably the same.

Where two or more layers of a polymer formed by plasma polymerization of a fluorohydrocarbon are present, each fluorohydrocarbon used may be the same or different, and are preferably the same.

It is generally preferred that the polymer which is deposited last, that is to say the polymer that forms the upper or environmentally exposed surface of the conformal coating, is obtainable by plasma polymerization of a fluorohydrocarbon.

A particularly preferred conformal coating of the present invention comprises four layers. This conformal coating is obtainable by (a) plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface of the electrical assembly, then (b) plasma polymerization of a compound of formula (I) and deposition of the resulting polymer onto the polymer formed in step (a), then (c) plasma polymerization of a compound of formula (I) and a fluorohydrocarbon, wherein the molar ratio of the compound of formula (I) to the fluorohydrocarbon is from 5:95 to 50:50, and deposition of the resulting polymer onto the polymer formed in step (b), and then (d) plasma polymerization of a compound of formula (I) and deposition of the resulting polymer onto the polymer formed in step (c). Optionally, a fifth and final layer can be added by plasma polymerization of a fluorohydrocarbon and deposition of the resulting polymer onto the polymer formed in step (d). The compound of formula (I) and fluorohydrocarbon are preferably as defined below, and more preferably are 1,4-dimethylbenzene and hexafluoropropylene ($C_3F_6$).

A further particularly preferred conformal coating of the present invention comprises six layers. This conformal coating is obtainable by (a) plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface of the electrical assembly, then (b) plasma polymerization of a compound of formula (I) and deposition of the resulting polymer onto the polymer formed in step (a), then (c) plasma polymerization of a compound of formula (I) and a fluorohydrocarbon, wherein the molar ratio of the compound of formula (I) to the fluorohydrocarbon is from 5:95 to 50:50, and deposition of the resulting polymer onto the polymer formed in step (b), then (d) plasma polymerization of a compound of formula (I) and deposition of the resulting polymer onto the polymer formed in step (c), then (e) plasma polymerization of a compound of formula (I) and a fluorohydrocarbon, wherein the molar ratio of the compound of formula (I) to the fluorohydrocarbon is from 5:95 to 50:50, and deposition of the resulting polymer onto the polymer formed in step (d), and then (f) plasma polymerization of a compound of formula (I) and deposition of the resulting polymer onto the polymer formed in step (e). Optionally, a seventh and final layer can be added by plasma polymerization of a fluorohydrocarbon and deposition of the resulting polymer onto the polymer formed in step (f). The compound of formula (I) and fluorohydrocarbon are preferably as defined below, and more preferably are 1,4-dimethylbenzene and hexafluoropropylene ($C_3F_6$).

The thickness of the conformal coating of the present invention will depend upon the number of layers of each polymer that are deposited.

A layer obtainable by plasma polymerization of a compound of formula (I) and a fluorohydrocarbon typically has a mean-average thickness of 10 to 100 nm, preferably 20 to 50 nm, for example about 30 nm A layer obtainable by plasma polymerization of a compound of formula (I) typically has a mean-average thickness of 250 to 400 nm, preferably 300 to 350 nm, for example about 325 or about 330 nm.

A layer obtainable by plasma polymerization of a fluorohydrocarbon typically has a mean-average thickness of 10 to 100 nm, preferably 20 to 60 nm, for example about 40 nm.

The thickness of each layer can be easily controlled by a skilled person. Plasma polymerization deposits the polymer at a uniform rate, and thus the thickness of a layer of polymer deposited is proportional to the deposition time. Accordingly, once the rate of deposition has been determined, a layer with a specific thickness can be deposited by controlling the duration of deposition.

The thickness of the conformal coating may be substantially uniform or may vary from point to point.

Precursor compounds of formula (I) have the following structure:

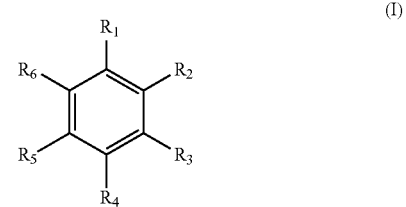

(I)

wherein $R_1$ represents $C_1$-$C_3$ alkyl or $C_2$-$C_3$ alkenyl; $R_2$ represents hydrogen, $C_1$-$C_3$ alkyl or $C_2$-$C_3$ alkenyl; $R_3$ represents hydrogen, $C_1$-$C_3$ alkyl or $C_2$-$C_3$ alkenyl; $R_4$ represents hydrogen, $C_1$-$C_3$ alkyl or $C_2$-$C_3$ alkenyl; $R_5$ represents hydrogen, $C_1$-$C_3$ alkyl or $C_2$-$C_3$ alkenyl; and $R_6$ represents hydrogen, $C_1$-$C_3$ alkyl or $C_2$-$C_3$ alkenyl.

As used herein, the term $C_1$-$C_3$ alkyl embraces a linear or branched hydrocarbon radical having 1 to 3, preferably 1 to 2 carbon atoms. Examples include methyl, ethyl, n-propyl and i-propyl.

As used herein, the term $C_2$-$C_3$ alkenyl embraces a linear or branched hydrocarbon radical having 2 or 3 carbon atoms and a carbon-carbon double bond. A preferred example is vinyl.

Typically, $R_1$ represents methyl or vinyl. Typically, $R_2$ represents hydrogen, methyl or vinyl. Typically, $R_3$ represents hydrogen, methyl or vinyl. Typically, $R_4$ represents hydrogen, methyl or vinyl. Typically, $R_5$ represents hydrogen, methyl or vinyl, preferably hydrogen. Typically, $R_6$ represents hydrogen, methyl or vinyl, preferably hydrogen.

Preferably, $R_5$ and $R_6$ represent hydrogen.

More preferably, $R_1$ represents methyl or vinyl, $R_2$ represents hydrogen, methyl or vinyl, $R_3$ represents hydrogen, methyl or vinyl, $R_4$ represents hydrogen, methyl or vinyl, $R_5$ represents hydrogen and $R_6$ represents hydrogen.

It is generally preferred that two of $R_2$ to $R_4$ represent hydrogen.

Preferred compounds of formula (I) are 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene or 1,2-divinyl benzene. 1,4-dimethylbenzene is particularly preferred.

A fluorohydrocarbon is a hydrocarbon material comprising fluorine atoms. Preferred fluorohydrocarbons are perfluoroalkanes, perfluoroalkenes, perfluoroalkynes, fluoroalkanes, fluoroalkenes and fluoroalkynes, wherein said compounds preferably contain up to 10 carbon atoms, more preferably up to five carbon atoms. Preferred examples include $CF_4$, $C_2F_4$, $C_2F_6$, $C_3F_6$, $C_3F_8$ and $C_4F_8$. A most preferred fluorohydrocarbon is hexafluoropropylene ($C_3F_6$).

It is particularly preferred that the or each compound of formula (I) is 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene or 1,2-divinyl benzene, and the or each fluorohydrocarbon is $CF_4$, $C_2F_4$, $C_2F_6$, $C_3F_6$, $C_3F_8$ or $C_4F_8$. A particularly preferred combination is 1,4-dimethylbenzene and hexafluoropropylene ($C_3F_6$).

The electrical assembly typically comprises a substrate comprising an insulating material, one or more conductive tracks present on least one surface of the substrate, and at least one electrical component connected to at least one conductive track. The conformal coating thus typically covers the surface of the substrate on which the one or more conductive tracks are present, the one or more of conductive tracks and the at least one electrical component.

An electrically conductive track typically comprises any suitable electrically conductive material. Preferably, an electrically conductive track comprises gold, tungsten, copper, silver, aluminium, doped regions of semi-conductor substrates, conductive polymers and/or conductive inks. More preferably, an electrically conductive track comprises gold, tungsten, copper, silver or aluminium.

Suitable shapes and configurations for the conductive tracks can be selected by a person skilled in the art for the particular assembly in question. Typically, an electrically conductive track is attached to the surface of the substrate along its entire length. Alternatively, an electrically conductive track may be attached to the substrate at two or more points. For example, an electrically conductive track may be a wire attached to the substrate at two or more points, but not along its entire length.

An electrically conductive track is typically formed on a substrate using any suitable method known to those skilled in the art. In a preferred method, electrically conductive tracks are formed on a substrate using a "subtractive" technique. Typically in this method, a layer of metal (e.g., copper foil, aluminium foil, etc.) is bonded to a surface of the substrate and then the unwanted portions of the metal layer are removed, leaving the desired conductive tracks. The unwanted portions of the metal layer are typically removed from the substrate by chemical etching or photo-etching, milling. In an alternative preferred method, conductive tracks are formed on the substrate using an "additive" technique such as, for example, electroplating, deposition using a reverse mask, and/or any geometrically controlled deposition process. Alternatively, the substrate may be a silicon die or wafer, which typically has doped regions as the conductive tracks.

The substrate typically comprises any suitable insulating material that prevents the substrate from shorting the circuit of electrical assembly. The substrate preferably comprises an epoxy laminate material, a synthetic resin bonded paper, an epoxy resin bonded glass fabric (ERBGH), a composite epoxy material (CEM), PTFE (Teflon), or other polymer materials, phenolic cotton paper, silicon, glass, ceramic, paper, cardboard, natural and/or synthetic wood based materials, and/or other suitable textiles. The substrate optionally further comprises a flame retardant material, typically Flame Retardant 2 (FR-2) and/or Flame Retardant 4 (FR-4). The substrate may comprise a single layer of an insulating material or multiple layers of the same or different insulating materials. The substrate may be the board of a printed circuit board (PCB) made of any one of the materials listed above.

An electrical component may be any suitable circuit element of an electrical assembly. Preferably, an electrical component is a resistor, capacitor, transistor, diode, amplifier, antenna or oscillator. Any suitable number and/or combination of electrical components may be connected to the electrical assembly.

The electrical component is preferably connected to an electrically conductive track via a bond. The bond is preferably a solder joint, a weld joint, a wire-bond joint, a conductive adhesive joint, a crimp connection, or a press-fit joint. Suitable soldering, welding, wire-bonding, conductive adhesive and press-fit techniques are known to those skilled in the art, for forming the bond. More preferably the bond is a solder joint, a weld joint or a wire-bond joint, with a solder joint most preferred.

Aspects of the invention will now be described with reference to the embodiment shown in FIGS. 1 to 4, in which like reference numerals refer to the same or similar components.

FIG. 1 shows an example of an electrical assembly of the invention. The electrical assembly comprises a substrate 1 comprising an insulating material, one or more conductive tracks 2 present on least one surface of the substrate 1, and at least one electrical component 3 connected to at least one conductive track 2. The conformal coating 4 covers the one or more conductive tracks 2, the at least one electrical component 3 and the surface 5 of the substrate 1 on which the one or more conductive tracks and the at least one electrical component are located.

Figure 2:
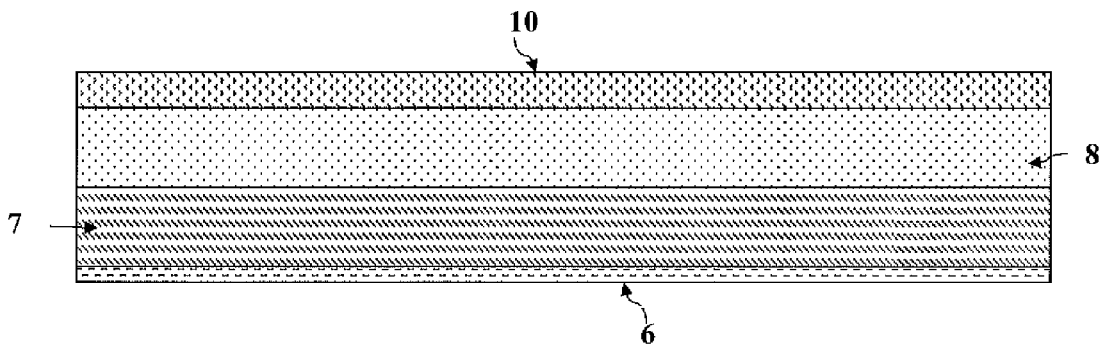
FIGS. 2 to 4 shows cross sections through the conformal coating in FIG. 1, and depict the structure of preferred coatings of the invention.

FIG. 2 shows a cross section through a preferred example of the conformal coating 4 in FIG. 1. The conformal coating comprises a first polymer 7 obtainable by plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface 6 of the electrical assembly, and a second polymer 8 obtainable plasma polymerization of a compound of formula (I) and deposition of the resulting polymer onto the polymer 7. Optionally, a third polymer 10 is added, which is obtainable by plasma polymerization of a fluorohydrocarbon and deposition of the resulting polymer onto the polymer 8.

Figure 3:
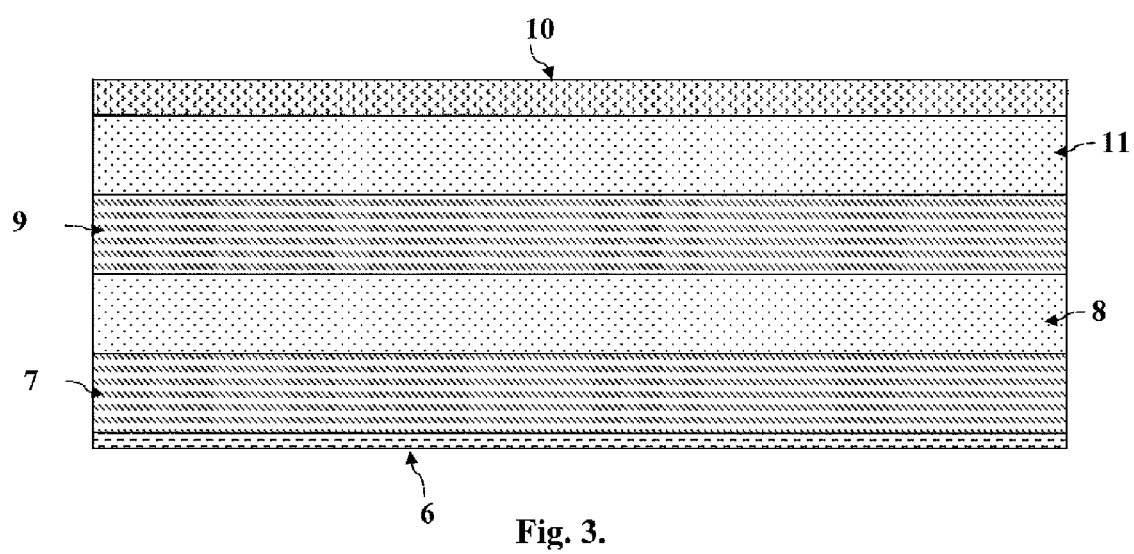

FIG. 3 shows a cross section through another preferred example of the conformal coating 4 in FIG. 1. The conformal coating comprises a first polymer 7 obtainable by plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface 6 of the electrical assembly, a second polymer 8 obtainable by plasma polymerization of a first compound of formula (I) and deposition of the resulting polymer onto the polymer 7, a third polymer 9 obtainable by plasma polymerization of compound of formula (I) and a fluorohydrocarbon, wherein the molar ratio of the compound of formula (I) to the fluorohydrocarbon is from 5:95 to 50:50, and deposition of the resulting polymer onto the polymer 8, and a fourth polymer 11 obtainable by plasma polymerization of a second compound of formula (I) and deposition of the resulting polymer onto the polymer 9. Optionally, a fifth polymer 10 is added, which is obtainable by plasma polymerization of a fluorohydrocarbon and deposition of the resulting polymer onto the polymer 11.

Figure 4:
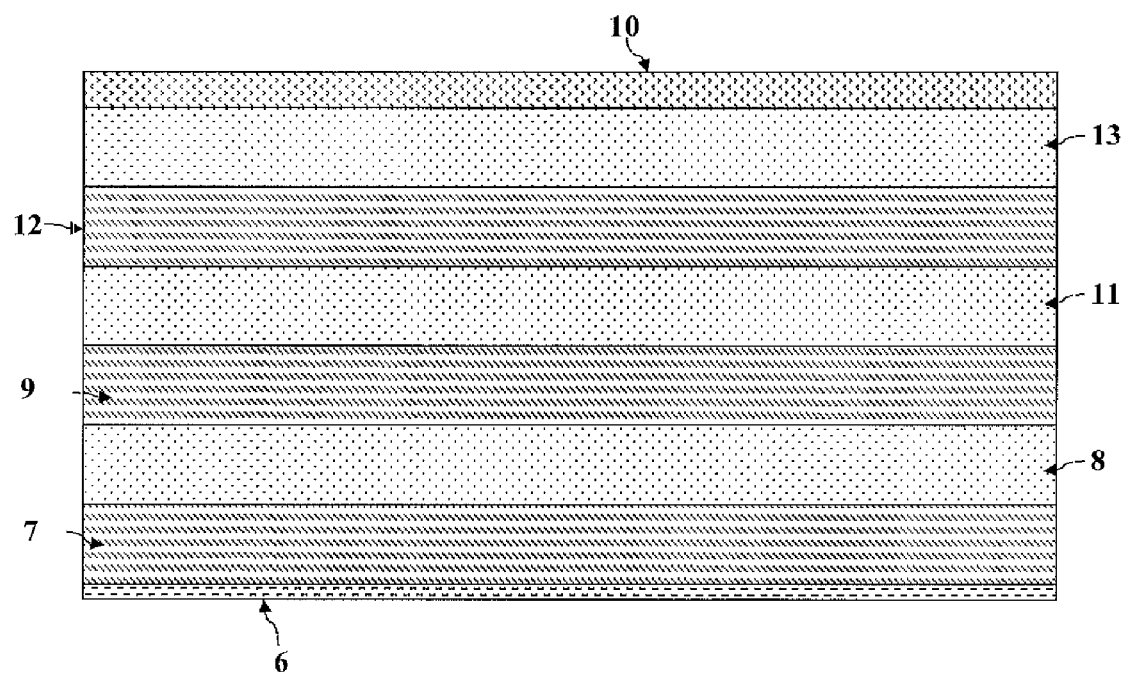

FIG. 4 shows a cross section through another preferred example of the conformal coating 4 in FIG. 1. The conformal coating comprises a first polymer 7 obtainable by plasma polymerization of a compound of formula (I) and a fluorohydrocarbon, wherein the molar ratio of the compound of formula (I) to the fluorohydrocarbon is from 5:95 to 50:50, and deposition of the resulting polymer onto at least one surface 6 of the electrical assembly, a second polymer 8 obtainable by plasma polymerization of a first compound of formula (I) and deposition of the resulting polymer onto the polymer 7, a third polymer 9 obtainable by plasma polymerization of compound of formula (I) and a fluorohydrocarbon, wherein the molar ratio of the compound of formula (I) to the fluorohydrocarbon is from 5:95 to 50:50, and deposition of the resulting polymer onto the polymer 8, a fourth polymer 11 obtainable by plasma polymerization of a second compound of formula (I) and deposition of the resulting polymer onto the polymer 9, a fifth polymer 12 obtainable by plasma polymerization of compound of formula (I) and a fluorohydrocarbon, wherein the molar ratio of the compound of formula (I) to the fluorohydrocarbon is from 5:95 to 50:50, and deposition of the resulting polymer onto the polymer 11, and a sixth polymer 13 obtainable by plasma polymerization of a second compound of formula (I) and deposition of the resulting polymer onto the polymer 12. Optionally, a seventh polymer 10 is added, which is obtainable by plasma polymerization of a fluorohydrocarbon and deposition of the resulting polymer onto the polymer 13.

Aspects of the invention will now be described with reference to the Examples

EXAMPLES

Example 1

An electrical assembly to be coated was placed into a plasma deposition chamber and the atmosphere was evacuated to 50 mTorr. 1,4-dimethylbenzene was introduced to the chamber at a flow rate of 5.7 sccm using a mass flow controller and hexafluoropropylene gas was introduced to the chamber at a flow rate of 19 sccm using a mass flow controller. This provided a 70:30 molar ratio of hexafluoropropylene to 1,4-dimethylbenzene in the chamber.

The RF generator was switched on at a power of 300 W and a plasma was formed. The 1,4-dimethylbenzene and hexafluoropropylene were ionized and then reacted to form a continuous and conformal coating on the electrical. Once the desired coating thickness had formed, the RF generator was switched off and the flow of monomer was stopped.

The vacuum in the chamber was maintained and 1,4-dimethylbenzene gas was then introduced to the chamber at a flow rate of approximately 19 sccm using a mass flow controller. The RF generator was switched on at a power of 300 W and a plasma was formed. The 1,4-dimethylbenzene was ionized and then reacted with itself to form a continuous and conformal coating on the previous coating. Once the desired coating thickness had formed, the RF generator was switched off and the flow of 1,4-dimethylbenzene was stopped.

While maintaining the vacuum, the above procedure was repeated twice.

Finally, hexafluoropropylene gas was introduced to the chamber at a flow rate of approximately 27 sccm using a mass flow controller. The RF generator was switched on at a power of 300 W and a plasma was formed. The hexafluoropropylene was ionized and then reacted with itself to form a continuous and conformal coating on the previous coatings. Once the desired coating thickness had formed, the RF generator was switched off and the flow of hexafluoropropylene was stopped.

The chamber was brought to atmospheric pressure and opened and the electrical assembly with a conformal coating removed.

The structure of multilayer coating is described in Table 1 below. The thicknesses of each layer were measured using a profilometer.

TABLE 1

| Layer | Thickness (nm) |
| --- | --- |
| Layer 7 - hexafluoropropylene | 40.2 |
| Layer 6 - 1,4-dimethylbenzene | 335.7 |
| Layer 5 - blend of 1,4-dimethylbenzene and hexafluoropropylene | 33.5 |
| Layer 4 - 1,4-dimethylbenzene | 335.7 |
| Layer 3 - blend of 1,4-dimethylbenzene and hexafluoropropylene | 33.5 |
| Layer 2 - 1,4-dimethylbenzene | 335.7 |
| Layer 1 - blend of 1,4-dimethylbenzene and hexafluoropropylene | 33.5 |
| Final coating comprising Layers 1 to 7 | 1147.8 |

Comparative Example 1

An electrical assembly to be coated was placed into a plasma deposition chamber and the atmosphere was evacuated to 50 mTorr. Hexafluoropropylene gas was introduced to the chamber at a flow rate of 27 sccm using a mass flow controller.

The RF generator was switched on at a power of 300 W and a plasma was formed. The hexafluoropropylene was ionized and then reacted to form a continuous and conformal coating on the electrical. Once the desired coating thickness had formed, the RF generator was switched off and the flow of monomer was stopped.

The vacuum in the chamber was maintained and 1,4-dimethylbenzene gas was then introduced to the chamber at a flow rate of approximately 19 sccm using a mass flow controller. The RF generator was switched on at a power of 300 W and a plasma was formed. The 1,4-dimethylbenzene was ionized and then reacted with itself to form a continuous and conformal coating on the previous coating. Once the desired coating thickness had formed, the RF generator was switched off and the flow of 1,4-dimethylbenzene was stopped.

While maintaining the vacuum, the above procedure was repeated three times, followed by a final application of a layer of plasma polymerized hexafluoropropylene gas as described above. The chamber was brought to atmospheric pressure and opened and the electrical assembly with a conformal coating removed.

The structure of multilayer coating is described in Table 2 below. The thicknesses of each layer were measured using a profilometer.

TABLE 2

| Layer | Thickness (nm) |
| --- | --- |
| Layer 9 - hexafluoropropylene | 40.2 |
| Layer 8 - 1,4-dimethylbenzene | 335.7 |
| Layer 7 - hexafluoropropylene | 40.2 |
| Layer 6 - 1,4-dimethylbenzene | 335.7 |
| Layer 5 - hexafluoropropylene | 40.2 |
| Layer 4 - 1,4-dimethylbenzene | 335.7 |
| Layer 3 - hexafluoropropylene | 40.2 |
| Layer 2 - 1,4-dimethylbenzene | 335.7 |
| Layer 1 - hexafluoropropylene | 40.2 |
| Final coating comprising Layers 1 to 7 | 1543.9 |

Example 2

The coatings formed in Example 1 and Comparative Example 1 were tested for robustness using standard tape test. Scotch Transparent Tape 600 (½ inch) was applied to an Au-slide coated in accordance with Example 1 or Comparative Example 1, then rolled over twice with a tape roll with even pressure and removed in one clear peel from left to right.

Fourier transform infrared spectroscopy (FTIR) was then used to determined whether or not the coatings remained intact. The coating of Example 1 remained intact (no difference in FTIR traces before and after the tape test). The majority of the coating of Comparative Example 1 was removed (FTIR trace after the test indicated very little coating remaining). This demonstrates that the coating of Example 1 is more robust than that of Comparative Example 1.

Example 3

The coatings of Example 1 and Comparative Example 1 were tested by applying a 10V potential across coated assemblies which were immersed in a 10 g/L salt solution. A failure was recorded when the current leakage across the coating reached 100 µA over a 48 hour test (2880 minutes). Assemblies coated with 900 nm single-layers of plasma polymerized 1,4-dimethylbenzene (denoted PDMB in Table 3) or with 50 nm single-layers of plasma polymerized hexafluoropropylene (denoted PHFP in Table 3) were also tested. A mean time to failure for the coated assemblies was recorded. The results are set out in Table 3 below.

TABLE 3

| Coating | Mean time to failure (minutes) |
| --- | --- |
| Comparative Example 1 | 2709 |
| 900 nm layer of PDMB | 225 |
| 50 nm layer of PHFP | 81 |
| Example 1 | 2746 |

These results show that the coating of Example 1 achieves a similar level of protection as a conformal coating as the coating of Comparative Example 1. The coatings of both Example 1 and Comparative Example 1 offer much higher levels of protection than single-layer coatings alone.

The invention claimed is:
1. An electrical assembly comprising:
a substrate; and
a conformal coating on at least one surface of the substrate, the conformal coating comprising:
(a) a plasma polymerized polymer of a compound of formula (I) and a fluorohydrocarbon, wherein the molar ratio of the compound of formula (I) to the fluorohydrocarbon is from 5:95 to 50:50:

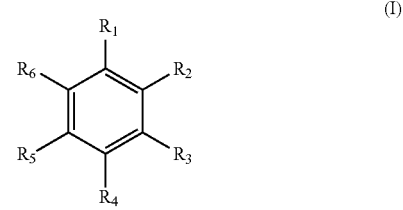

(I)

wherein:
$R_1$ represents $C_1$-$C_3$ alkyl or $C_2$-$C_3$ alkenyl;
$R_2$ represents hydrogen, $C_1$-$C_3$ alkyl or $C_2$-$C_3$ alkenyl;
$R_3$ represents hydrogen, $C_1$-$C_3$ alkyl or $C_2$-$C_3$ alkenyl;
$R_4$ represents hydrogen, $C_1$-$C_3$ alkyl or $C_2$-$C_3$ alkenyl;
$R_5$ represents hydrogen, $C_1$-$C_3$ alkyl or $C_2$-$C_3$ alkenyl; and
$R_6$ represents hydrogen, $C_1$-$C_3$ alkyl or $C_2$-$C_3$ alkenyl, and
(b) a plasma polymerized polymer of a compound of formula (I) on the polymer of (a).
2. The electrical assembly of claim 1, wherein the conformal coating further comprises:
(c) a plasma polymerized polymer of a compound of formula (I) and a fluorohydrocarbon on the polymer of (b), wherein the molar ratio of the compound of formula (I) to the fluorohydrocarbon is from 5:95 to 50:50; and
(d) a plasma polymerized polymer of a compound of formula (I) on the polymer of (c).
3. The electrical assembly of claim 2, wherein the conformal coating further comprises:
(e) a plasma polymerized polymer of a compound of formula (I) and a fluorohydrocarbon on the polymer of (d), wherein the molar ratio of the compound of formula (I) to the fluorohydrocarbon is from 5:95 to 50:50; and
(f) a plasma polymerized polymer of a compound of formula (I) on the polymer of (e).
4. The electrical assembly of claim 1, wherein the conformal coating further comprises an outer layer comprising a plasma polymerized polymer of a fluorohydrocarbon.
5. The electrical assembly of claim 1, wherein at least one of the compounds of formula (I) is selected from a group consisting of 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene and 1,2-divinyl benzene.

6. The electrical assembly of claim 1, wherein the fluorohydrocarbon is selected from a group consisting of $CF_4$, $C_2F_4$, $C_2F_6$, $C_3F_6$, $C_3F_8$ and $C_4F_8$.

7. The electrical assembly of claim 1, wherein at least one of the compounds of formula (I) is 1,4-dimethylbenzene and the fluorohydrocarbon is $C_3F_6$.

8. The electrical assembly of claim 1, wherein the molar ratio of the compound of formula (I) from (a) to the fluorohydrocarbon from (a) is from 25:75 to 35:65.

9. The electrical assembly of claim 1, wherein:
the substrate comprises an insulating material; and
the electrical assembly further comprises:
one or more conductive tracks present on least one surface of the substrate, and
at least one electrical component connected to at least one conductive track.

10. The electrical assembly of claim 9, wherein the conformal coating covers the one or more conductive tracks, the at least one electrical component, and the surface of the substrate on which the one or more conductive tracks and the at least one electrical component are located.

11. An electrical assembly comprising:
a substrate comprising an insulating material;
one or more conductive tracks present on least one surface of the substrate,
at least one electrical component connected to at least one conductive track; and
a conformal coating that covers the one or more conductive tracks, the at least one electrical component, and the surface of the substrate on which the one or more conductive tracks and the at least one electrical component are located, the conformal coating comprising:
(a) a plasma polymerized polymer of a compound of 1,4-dimethylbenzene and $C_3F_6$, wherein the molar ratio of the compound of 1,4-dimethylbenzene to the $C_3F_6$ is from 25:75 to 35:65:
(b) a plasma polymerized polymer of a compound of 1,4-dimethylbenzene on the polymer of (a); and
(c) an outer layer comprising a plasma polymerized polymer of $C_3F_6$.

* * * * *